Oct. 18, 1966 A. H. ASHLEY 3,280,342

LIMITING AMPLIFIER

Filed Oct. 1, 1963 2 Sheets-Sheet 1

INVENTOR.
ALBERT H. ASHLEY

BY Spencer E. Olson

ATTORNEY

LIMITING AMPLIFIER

Filed Oct. 1, 1963 2 Sheets-Sheet 2

INVENTOR.
ALBERT H. ASHLEY

BY Spencer E. Olson

ATTORNEY.

United States Patent Office 3,280,342
Patented Oct. 18, 1966

3,280,342
LIMITING AMPLIFIER

Albert H. Ashley, Holliston, Mass., assignor to Sylvania Electric Products Inc., a corporation of Delaware Filed Oct. 1, 1963, Ser. No. 313,054
5 Claims. (Cl. 307—88.5)

This invention relates generally to electronic pulse-forming circuitry and more particularly to an improved limiting amplifier for use in peak detection.

A critical requirement of many systems is the ability to detect the time at which the peak amplitude of an input signal occurs, a requirement which is complicated further if the input signal varies over a wide dynamic range. For example, in the NRZI (non-return to zero modified) method of recording data on magnetic tape, the detection of the peak time of such recorded data is usually accomplished by differentiating the signal which remains after the linear amplification and thresholding necessary to reject system noise, and amplifying the differentiated signal to a level sufficient for triggering a Schmitt trigger. A typical Schmitt trigger is shown in the G. E. Transistor Manual, fifth edition, at page 122 in FIG. 11.14*a*. Such a circuit has, as is well known in the art, an upper trigger point and a lower trigger point such that the circuit is triggered by a signal at one level and is cut off when the signal amplitude is at some lower level. For example, in a typical application the circuit would be triggered when the input signal is at a value of −5 volts, and be cut off when the signal becomes more positive than −3 volts. It is obvious that a change in the input bias level of such a triggering circuit has the same effect as changing the point in time at which an incoming signal causes the Schmitt circuit to be triggered.

In a system of the type described above, the gain of the amplifier whose output is applied to the Schmitt trigger, must be sufficiently high to permit a signal small in relation to an input clip level to pass, in order that the circuit threshold level not be both a function of the D.C. clip level and the frequency content of the signal. Another requirement of such an amplifier is that the integrity of the zero crossover or peak time of the incoming signal be maintained over the entire dynamic range of input signals; that is, although some phase shift is tolerable, the phase shift must remain constant for all signals.

Limiting amplifiers of the prior art generally rely on uncontrolled saturation and cut-off to provide the limiting. This approach consists in amplifying the signal as much as is necessary to permit a small pulse to get through, and "living with" the attendant shift in output level caused by a succession of large pulses. Typical of such prior art amplifiers is the circuit of FIG. 1 which includes a transistor 16 biased in the active region by a well known resistive divider biasing means. A small input signal at terminal 10 sees a grounded emitter input impedance equal to the beta of the transistor times the emitter impedance of the transistor ($\beta r_e$), of the same order of magnitude as the differentiating resistor 11. Therefore, the phase shift is dependent upon the transistor characteristics. A large signal turns the transistor completely off and pushes some charge through the diode 15, connected between the base and emitter, into the emitter bypass capacitor 18 during the first half of the pulse. During the second half of the pulse the current through the base input capacitor 12 reverses polarity and saturates the transistor, drawing more current (charge) out of the emitter by-pass capacitor 18 than was put in during the first half of the pulse, due to the lower driving impedance of the conducting transistor. Therefore, for each large signal, there is a net negative charge on capacitor 18 with the result that a succession of large pulses causes the transistor to become biased off, considerably raising the effective threshold of the amplifier such that a resulting burst of one or more lower amplitude signals would not be detected. Such a cut-off condition also causes a shift in the level at the input to the Schmitt trigger (terminal 21), resulting in variations in timing between peaks of large and small signals.

The amplifier of FIG. 1 gives satisfactory performance if the information bit rate is sufficiently low that the period between signals allows the amplifier to recover, and in situations where reliability requirements are not stringent. With the advent of higher information bit rates, however, of the order of tens of kilocycles per second, a shift in timing of the output cannot be tolerated. Moreover, an inability to detect small signals subsequent to a succession of larger signals causes an error rate which is unacceptable, especially in military applications. The foregoing shortcomings of prior art amplifiers are particularly troublesome in magnetic tape systems in which the detected signal is largely third harmonic in nature.

It is a principal object of this invention to provide a peak detecting limiting amplifier having minimum shift in output level for input signals of relatively high amplitude while retaining the capability of detecting immediately following input signals of relatively much lower amplitude.

It is a particular object of this invention to provide a peak detecting limiting amplifier suitable for use in a magnetic tape recording system wherein the signals are largely third harmonic in nature.

Inherent in attaining the foregoing objects is the requirement that the input impedance of the amplifier be maintained as low as possible at all times.

These and other related objects are accomplished in one illustrative embodiment of the invention by a combination of a feedback network which coacts with a novel diode limiting network to cause low feedback for small signals and large feedback for large signals, thereby extending the dynamic range to the desired value, yet maintaining a low input impedance at all times.

The foregoing and other objects, features and advantages of the invention, and a better understanding of its construction and operation will become apparent from the following detailed description taken in conjunction with the accompanying drawings, in which.

Figure 1:
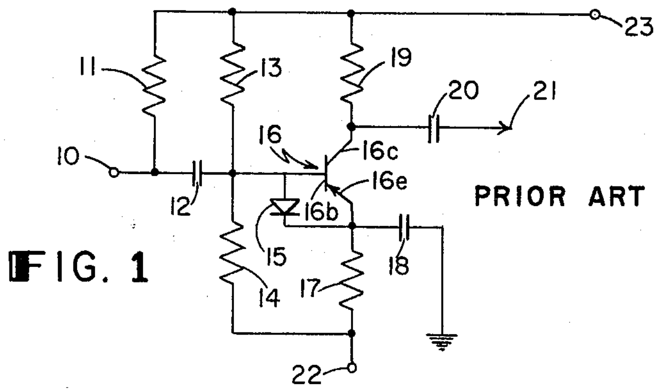
FIG. 1 is a schematic circuit diagram of a typical amplifier of the prior art.

Summarizing the operation of the typical prior art amplifier of FIG. 1, for each large input signal there is a net negative charge on capacitor 18, with the result that for a succession of closely spaced large signals, the transistor 16 tends to be biased off. This effectively raises the threshold of the amplifier such that a small signal may not be detected if it follows a succession of larger signals. This also causes a variation in timing detection between signals of unequal phase shifts through the amplifier. The aforementioned difficulties are especially prevalent when detecting signals from a magnetic tape. As mentioned previously, such signals are largely third harmonic in nature when the detected signal is large, with the smaller signals being mostly first harmonic. This means that the resultant signal current through capacitor 12 is disproportionately greater for large signals, resulting in either a more pronounced phase shift through the amplifier for large signals, or imposing a more severe high gain requirement on the amplifier for smaller signals.

Figure 2:
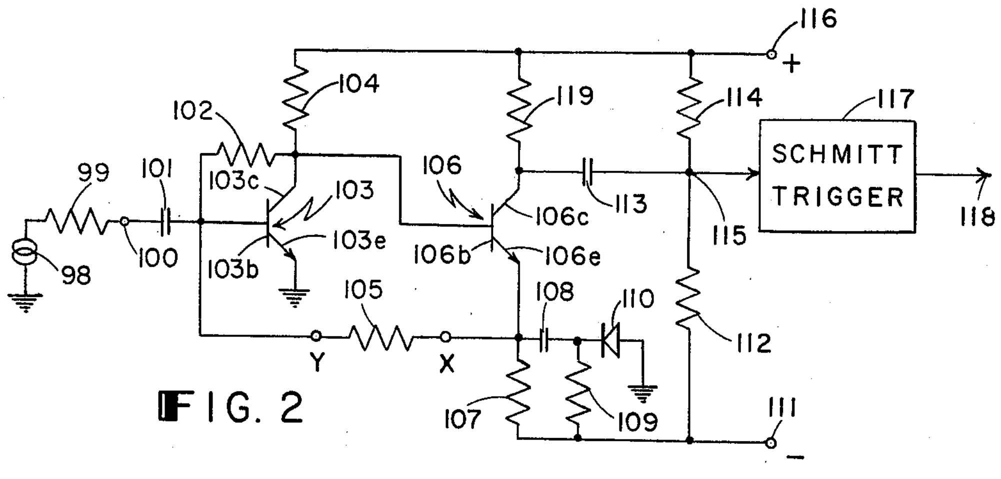
FIG. 2 is a schematic circuit diagram of a peak-detecting, limiting amplifier embodying the invention.
Figure 2A:
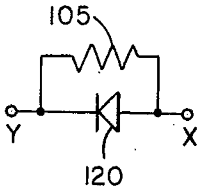
FIG. 2A is a schematic representation of an alternative form of a portion of the circuit of FIG. 2.

The circuit of the present invention, illustrated in FIG. 2, eliminate most of the foregoing difficulties of prior art limiting amplifiers. In this circuit the input terminal 100 is connected via capacitor 101 to the base 103*b* of transistor. Typically, the input is derived from an equivalent voltage source 98 connected in series with a differentiating resistor 99 having a value of the order of one thousand ohms. Transistor 103 is connected in common emitter configuration with the emitter 103*e* connected to a point of ground potential and collector 103*c* connected via resistor 104 to a source of positive potential, represented by terminal 116. Resistor 102 provides a feedback path from collector 103*c* to base 103*b*. The collector 103*c* is also coupled directly to the base 106*b* of transistor 106. The collector 106*c* is connected via resistor 110 to the aforementioned source of positive potential 116 and via capacitor 113 to the output terminal 115, which is also the input to a Schmitt trigger circuit 117. The emitter 106*e* is connected via resistor 107 to a source of negative potential represented by terminal 111, and is additionally connected via capacitor 108 in series with resistor 109 to the negative potential source 111, with a diode 110 connected from the junction of capacitor 108 and resistor 109 to a point of ground potential. A resistor 105 provides a feedback path from the emitter of transistor 106 to the base of transistor 103. Alternatively, this feedback path may comprise resistor 105 and a diode 120 connected in parallel therewith as shown in FIG. 2A. The output terminal 115 is held at the proper D.C. level by the voltage divider consisting of resistors 114 and 112 connected in series between the source of positive potential 116 and the source of negative potential 111. This D.C. level is adjusted to equal the upper trigger point of the Schmitt trigger circuit, thereby maintaining the integrity of the zero-crossover point.

A circuit which has been successfully operated had the following component values and commercial identities:

| | | |
|---|---|---|
| Resistors **102** and **104** | ohms | 6.8K |
| Resistors **105** and **119** | do | 2.2K |
| Resistors **107** and **112** | do | 5.23K |
| Resistor **109** | do | 4.87K |
| Resistor **114** | do | 8.87K |
| Capacitor **101** | mmfd | 390 |
| Capacitors **108** and **113** | mfd | 15 |
| Transistors **103** and **106** | | 2N2719 |
| Diodes **110** and **120** | | 1N276 |
| Potential at terminal **116** | | +12v. |
| Potential at terminal **111** | | −12v. |

This circuit was designed for operation in conjunction with a Schmitt trigger circuit having a lower trigger point of −5 volts and an upper trigger point of −3 volts.

Figure 3A:
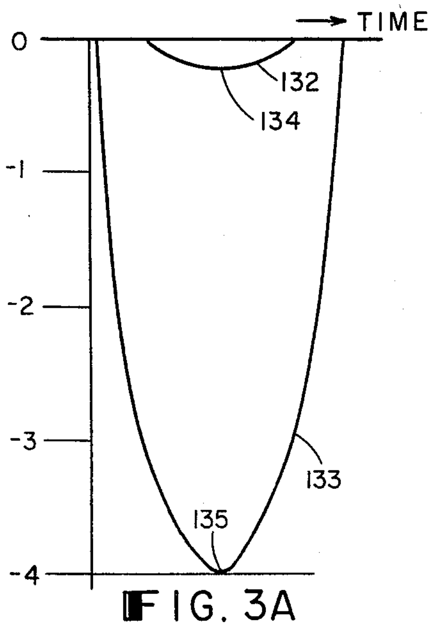
FIG. 3A are curves representing typical maximum and minimum input signals to the amplifier of FIG. 2.
Figure 3C:
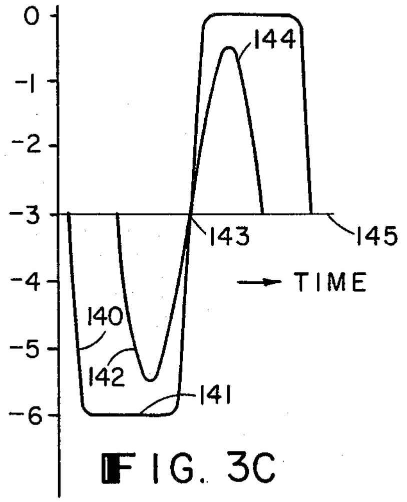
FIG. 3C depicts typical output pulses from the amplifier.
Figure 3B:
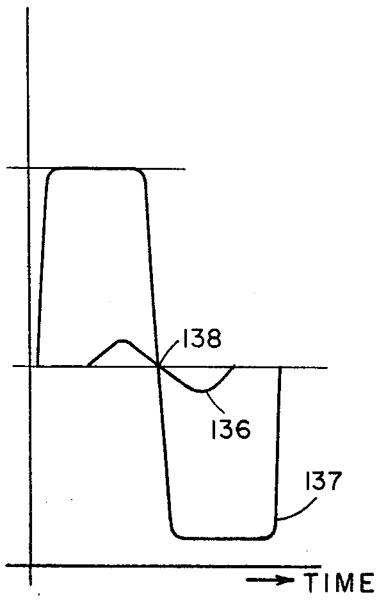
FIG. 3B depicts the input pulses of FIG. 3A after differentiation.
Figure 4:
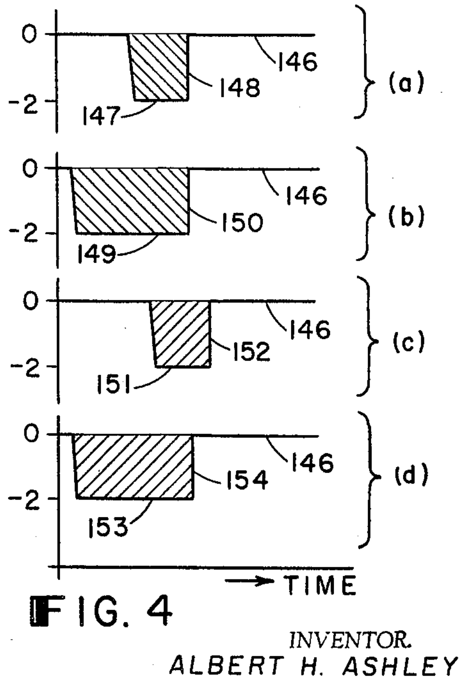
FIGS. 4A and 4B represent typical output pulses from a Schmitt trigger circuit when used with the amplifier of the invention; and, FIGS. 4C and 4D represent typical output pulses from a Schmitt trigger circuit when used with the prior art amplifier of FIG. 1.

The operation of the invention will be better understood from the following detailed description and reference to FIGS. 3 and 4. The input signals to terminal 100 are derived from a circuit which is nearly equivalent to a unipolarity pulse voltage source 98 in series with a resistor. The internal impedance of the sources (represented by resistor 99), which is of the order of one thousand ohms, in series with capacitor 101, forms a differentiating network, and if the input impedance of transistor 103 is kept sufficiently low, below about one hundred ohms, differentiation is essentially independent of the transistor characteristics. This low input impedance is satisfied by providing feedback from the collector to the base of transistor 103 via resistor 102 with additional feedback from the emitter 106*e* of transistor 106 to the base of transistor 103 via the feedback resistor 105 (or in the alternative, resistor 105 in parallel with diode 120).

Referring to FIG. 3A, in a typical application the minimum detectable input signal 132 to the amplifier, after clipping necessary to remove objectional noise, is −0.2 volt, while the maximum expected input signal 133 is −4.0 volts. Following differentiation, and after amplification by transistor 103, the minimum input signal 132 appears at the collector 103*c* as signal 136 (FIG. 3B) and a maximum input signal 133 appears at the collector as signal 137. Because the input impedance of transistor 103 is small in relation to the differentiating resistor, the phase shift through transistor 103 is minimal and substantially constant over the designed range of input signals, with the result that the ZERO crossover points 138 of signals 136 and 137 are essentially identical.

For large input signals, additional limiting is provided by the emitter network of transistor 106. The circuit values are chosen such that the current through resistor 109 and diode 110 is equal to the current through the emitter 106*e*, which can be closely determined because the heavy direct current feedback, provides a fixed bias very nearly equal in magnitude to the base to emitter voltage drop of transistor 106. This current is optimized to yield the desired voltage output when applied to the A.C. collector load of transistor 106. Thus, it is seen that a large signal 137 applied to the base of transistor 106 turns this transistor on until its emitter current has doubled, drawing the current from diode 110 through the path presented by capacitor 108. At this point, diode 110 is turned off (back-biased), causing the stage gain to drop below unity, thereby sharply limiting the negative excursion at the collector 106*c* and additionally limiting the charging current in capacitor 108. Since diode 110 is back-biased, heavy feedback via resistor 105 is also provided to the base of transistor 103. On the negative portion of the signal 137, transistor 106 is turned off, but the change in collector current is held to twice the initial emitter current with the resultant positive collector excursion being equal to the previous negative excursion at the collector. Therefore the resultant output signal 141 (FIG. 3C) at terminal 115 is symmetrical, even though the input signal 137 to the base 106*b* is non-symmetrical.

With a small input signal 132 and the resultant differentiated signal 136 applied at the base of transistor 106, transistor 106 remains in the active region because capacitor 108 and diode 110 provide a low A.C. impedance path to ground resulting in a minimal self-bias on transistor 106 and very little signal feedback to transistor 103. Therefore, the amplifier maintains a high gain, yielding the symmetrical output signal 144 (FIG. 3C) at terminal 115.

As shown in FIG. 3C, the phase shift is minimal and substantially constant over a wide range of input signal amplitudes so that the zero crossover points 143 are substantially coincident for large and small signals. Since the output terminal 115 is biased at −3 volts, the excursions of the output signal are from this level. When the output signal, whether 140 or 142, reaches a level of −5 volts the Schmitt circuit is triggered, the leading edge of the triggered pulse 147 or 149 (FIG. 4) being in time coincidence with the time the triggering pulse reaches the −5 volt level. When the triggering pulse returns to the −3 volt level, the Schmitt circuit is cut off, whereby the trailing edge 148 or 150 of the triggered pulses 147 or 149, respectively, corresponds in time to the zero-crossover point 143, and hence to the time of the peak 134 or 135 of the input pulses 132 and 133, respectively. In a typical test of the amplifier using the full dynamic range of input signals spaced twenty-two microseconds apart, the timing between the output signals from the Schmitt trigger varied by less than two-tenths of a microsecond, whereas with similar inputs to the prior art amplifier of FIG. 1 the timing between signals varied as much as one and a half microseconds.

As mentioned previously, the present amplifier can provide even more limiting, thus allowing a wider dynamic range of input signals, by placing a diode 120 in parallel with resistor 105, thereby providing more feedback for larger signals. It will also be obvious to ones skilled in the art that minor variations may be made without departing from the spirit of the invention such as, for example, replacing the NPN transistors with PNP transistors and reversing the polarity of the diodes and the reference potentials. It is, therefore, intended that the invention not be limited to the specifics of the preceding description of one preferred embodiment, but rather to embrace the full scope of the following claims.

What is claimed is:

1. A peak-detecting, limiting amplifier comprising, first and second transistors each having base, emitter and collector electrodes, an input terminal, a first capacitor connected between said input terminal and the base of said first transistor, first and second sources of potential, first and second resistors respectively connected between the collector electrodes of said first and second transistors and said first source of potential, a direct connection from the collector electrode of said first transistor to the base electrode of said second transistor, a third resistor connected between the collector and base electrodes of said first transistor, means connecting the emitter electrode of said first transistor to a point of reference potential, a network including a fourth resistor connected between the emitter of said second transistor and said second source of potential, a second capacitor and a fifth resistor connected in series in the named order between the emitter electrode of said second transistor and said second source of potential, and a diode connected from the junction of said second capacitor and said fifth resistor to said point of reference potential, a voltage divider connected between said first and second sources of potential, an output terminal connected to a point on said voltage divider, means connecting said output terminal to a trigger circuit, a third capacitor connected between the collector electrode of said second transistor and said output terminal, and a resistive feedback path connected between the emitter electrode of said second transistor and the base electrode of said first transistor.

2. A peak-detecting, limiting amplifier for producing output pulses having substantially the same zero crossover point over a wide range of input signal amplitudes, said amplifier comprising, first and second transistors each having base, emitter and collector electrodes, an input terminal to which a source of input pulses is adapted to be connected, a first capacitor connector between said input terminal and the base of said first transistor and operative in conjunction with the impedance of said source of pulses to differentiate said input pulses, a first source of energizing potential for said transistors, first and second resistors connected between the collectors of said first and second transistors, respectively, and said first source of energizing potential, a direct connection from the collector of said first transistor to the base of said second transistor, means connecting the emitter electrode of said first transistor to a point of reference potential, a second source of energizing potential, a network including a second capacitor connected between the emitter of said second transistor and said second source of potential, a diode having anode and cathode electrodes connected between said network and a point of reference potential, said network and said diode being operative in response to changes in the current through said second transistor to vary the gain of said second transistor, a first feedback path connected from the collector to the base of said first transistor, a second feedback path connected from the emitter of said second transistor to the base of said first transistor, a voltage divider connected between said first and second sources of potential, an output terminal from which said output pulses are derived connected to a point on said voltage divider, and a third capacitor connected between the collector of said second transistor and said output terminal.

3. The circuit according to claim 2 wherein said second feedback path comprises a resistor.

4. The circuit according to claim 2 wherein said second feedback path comprises a third resistor and a second diode connected in parallel with said third resistor.

5. A peak detecting, limiting amplifier for producing output pulses having substantially the same zero crossover point over a wide range of input signal amplitudes, said amplifier comprising first and second transistors each having base, emitter and collector electrodes, an input terminal to which a source of input pulses is adapted to be connected, means connected between said input terminal and the base of said first transistor base operative in conjunction with the impedance of said source of pulses and the base-to-emitter impedance of said first transistor to differentiate said input pulses, a first source of energizing potential for said transistors, means connected between said first source of energizing potential and the collector of said first transistor to provide the proper operating potential for said first transistor, means directly connecting the collector of said first transistor to the base of said second transistor, means connecting the emitter electrode of said first transistor to a point of reference potential, means connected between said first source of energizing potential and the collector of said second transistor providing the proper operating potential for said second transistor, a second source of energizing potential, means connecting the emitter electrode of said second transistor to said second source of energizing potential, means connecting the emitter electrode of said second transistor to said point of reference potential and providing a unipolarity signal path between the emitter electrode of said second transistor and said point of reference potential, means for controlling the current in said unipolarity signal path, a first feedback path connected from the collector to the base of said first transistor, a second feedback path connected from the emitter of said second transistor to the base of said first transistor, a voltage divider connected between said first and second sources of energizing potential, an output terminal from which said output pulses are derived connected to a point on said voltage divider, and a capacitor connected between the collector of said second transistor and said output terminal.

References Cited by the Examiner

UNITED STATES PATENTS

| | | | |
|---|---|---|---|
| 3,179,819 | 4/1965 | Lockwood | 307—88.5 |
| 3,209,211 | 9/1965 | Du Vivier | 307—88.5 |

ARTHUR GAUSS, *Primary Examiner.*

R. H. EPSTEIN, *Assistant Examiner.*